United States Patent
Chang

(10) Patent No.: US 9,439,308 B2
(45) Date of Patent: Sep. 6, 2016

(54) ELECTRONIC DEVICE WITH CONCEALED COUPLING MEMBER

(71) Applicant: HON HAI PRECISION INDUSTRY CO., LTD., New Taipei (TW)

(72) Inventor: Shao-Han Chang, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 112 days.

(21) Appl. No.: 14/546,884

(22) Filed: Nov. 18, 2014

(65) Prior Publication Data

US 2016/0120047 A1    Apr. 28, 2016

(30) Foreign Application Priority Data

Oct. 22, 2014   (CN) .......................... 2014 1 0565466

(51) Int. Cl.
*H05K 5/02*    (2006.01)

(52) U.S. Cl.
CPC .......... *H05K 5/0217* (2013.01); *H05K 5/0221* (2013.01)

(58) Field of Classification Search
CPC .......................... H05K 5/0221; H05K 5/0217
USPC ......... 292/129; 411/356; 174/559, 561, 562, 174/560
See application file for complete search history.

(56) References Cited

U.S. PATENT DOCUMENTS

| 7,607,553 | B2* | 10/2009 | Weber | H02G 3/086 174/562 |
| 8,897,026 | B2* | 11/2014 | Duan | H05K 7/142 361/728 |
| 8,933,347 | B2* | 1/2015 | Kiple | B23P 11/00 174/541 |
| 2003/0145441 | A1* | 8/2003 | Andersson | E05B 47/0038 24/652 |
| 2007/0279581 | A1* | 12/2007 | Chang | G02B 6/0081 351/153 |
| 2008/0182633 | A1* | 7/2008 | Imaizumi | H04M 1/0249 455/575.1 |
| 2011/0007454 | A1* | 1/2011 | Tang | H05K 5/0217 361/679.01 |
| 2013/0003267 | A1* | 1/2013 | Pan | H04M 1/026 361/679.01 |
| 2014/0102745 | A1* | 4/2014 | Gomez | F16B 35/06 174/50 |
| 2016/0014911 | A1* | 1/2016 | Xu | H05K 5/0017 361/679.01 |

* cited by examiner

*Primary Examiner* — Hoa C Nguyen
*Assistant Examiner* — Keith Depew
(74) *Attorney, Agent, or Firm* — Zhigang Ma

(57) ABSTRACT

An electronic device with a concealed coupling member includes a first shell, a second shell, and at least one locking mechanism. The first shell includes a sidewall with a first through hole. Each locking mechanism includes a chassis, a screw, a first coupling portion, and a second coupling portion. The first coupling portion defines a second through hole, the second coupling portion defines a third through hole. The first through hole can communicate with the second through hole and the third through hole. The screw passes through the third through hole and the second through hole to couple the first shell to the second shell.

15 Claims, 4 Drawing Sheets

ELECTRONIC DEVICE WITH CONCEALED COUPLING MEMBER

FIELD

The subject matter herein generally relates to electronic devices, and particularly, to an electronic device with a concealed coupling member.

BACKGROUND

A type of housing for portable electronic devices is assembled via a plurality of clamps and corresponding grooves to have a good appearance. The plurality of clamps and grooves can replace a plurality of screws in the housings of the portable devices.

BRIEF DESCRIPTION OF THE DRAWINGS

Implementations of the present technology will now be described, by way of example only, with reference to the attached figures.

DETAILED DESCRIPTION

Figure 1:
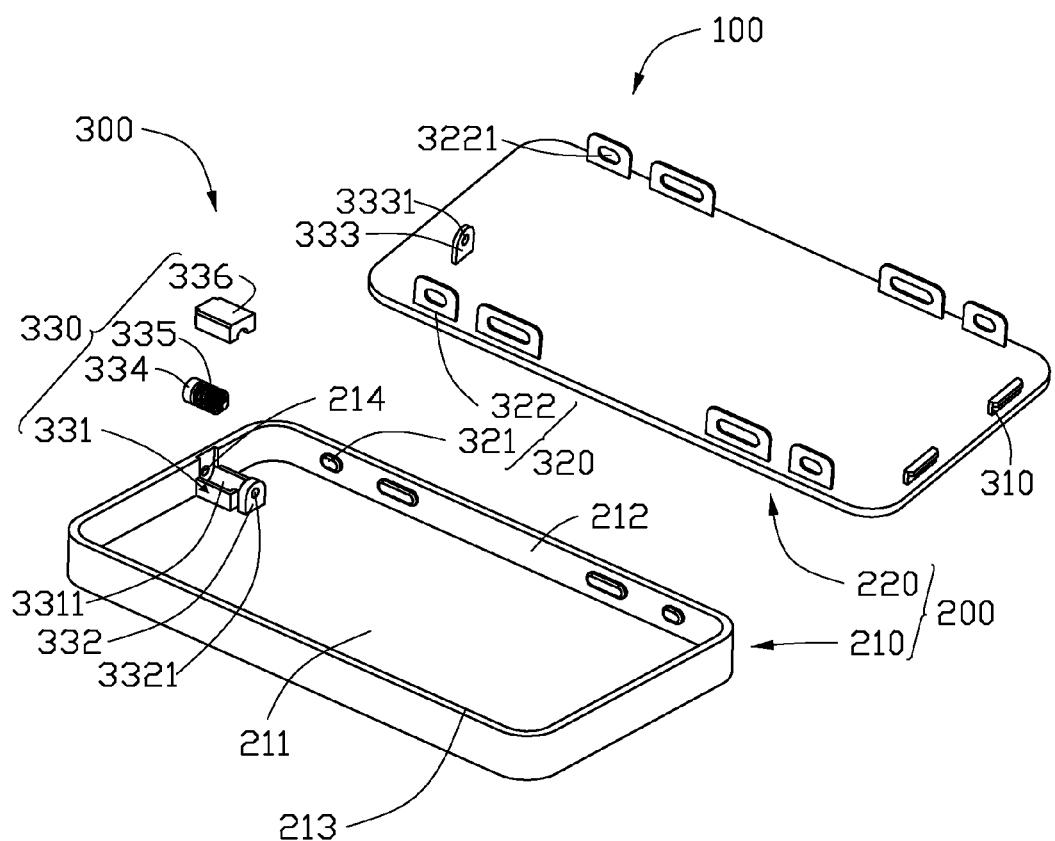
FIG. 1 is an exploded-isometric view of an embodiment of an electronic device with a concealed coupling member.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Throughout this disclosure, the term "comprising," when utilized, means "including, but not necessarily limited to"; it specifically indicates opening-ended inclusion or membership in the so-described combination, group, series and the like.

The present disclosure is described in relation to an electronic device with concealed coupling member.

FIG. 1 illustrates an embodiment of an electronic device with a concealed coupling member 100. The electronic device with the concealed coupling member 100 can include a housing 200 and a coupling member 300 positioned in the housing 200. The housing 200 can include a first shell 210 and a second shell 220 coupled to the first shell 210. The first shell 210 can include a bottom plate 211, a plurality of sidewalls 212 extending vertically from sides of the bottom plate 211, a flange 213 positioned on the plurality of sidewalls 212 and at least one first through hole 214 positioned on the plurality of sidewalls 212. The second shell 220 can have a rectangular plate shape. The shape of the second shell 220 can be similar to the shape of the first shell 210. The first shell 210 and the second shell 220 can cooperatively define a receiving space (not labeled) configured to receive electronic components (not shown).

The coupling member 300 can include at least one clasp 310, a latching mechanism 320 and at least one locking mechanism 330. At least one clasp 310 can be positioned on the second shell 210 and adjacent to edges (not labeled) of the second shell 220. At least one clasp 310 can be engaged with the flange 213 of the first shell 210. In the embodiment, at least one clasp 310 can be positioned on and adjacent to the one edge (not labeled) of the second shell 220.

The latching mechanism 320 can include at least one first latching member 321 and at least one second latching member 322 coupled to at least one first latching member 321. At least one first latching member 321 can be positioned on at least one sidewall 212. At least one first latching member 321 can be a projection and face the interior of the first shell 210. At least one second latching member 322 can be positioned on and can be adjacent to at least one edge (not labeled) of the second shell 220. At least one second latching member 322 can be formed extending vertically from second shell 200 corresponding with at least one first latching member 321, and each of at least one second latching member 322 can define a latching hole 3221. At least one first latching member 321 can be engaged with the latching holes 3221. In the embodiment, at least one first latching member 321 can be positioned on two parallel sidewalls 212. At least one second latching member 322 can be positioned on the two edges (not labeled) of the second shell 220 corresponding to the two parallel sidewalls 212. The first latching member 321 and the first shell 210 can be unibody and can be formed by injection molding. The second latching member 322 and the second shell 220 can also be unibody and can be formed by injection molding.

The locking mechanism 330 can include a chassis 331 positioned on the bottom plate 211 of the first shell 210, a first coupling portion 332 adjacent to one end of the chassis 331, a second coupling portion 333 positioned on the second shell 220, a screw 334, a spring 335 coiled around the screw 334 and a cover 336 positioned on the chassis 331. The chassis 331 can define a receiving groove 3311. The receiving groove 3311 can have a U-shape configured to receive the screw 334 and the spring 335. One end of the chassis 331 can be adjacent to one of the plurality of sidewalls 212. The receiving groove 3311 can correspond to the first through hole 214. The first coupling portion 332 can be vertically positioned on the bottom plate 211 of the first shell 210 and be adjacent to other end of the chassis 331. A second through hole 3321 can be defined in the first coupling portion 332. The second through hole 3321 can include an internal thread (not labeled) and correspond to the first through hole 214. The second coupling portion 333 can define a third through hole 3331. The third through hole 3331 can include an internal thread (not labeled). The shape of the second coupling portion 333 can be similar to the shape of the first coupling portion 332. The second coupling portion 333 can be positioned between the chassis 331 and the first coupling portion 332, and the third through hole 3331 can communicate with the first through hole 214 and the second through hole 3321 when the first shell 210 is coupled to the second shell 220. The cover 336 and the chassis 331 can cooperatively define a receiving space configured to receive the screw 334 and the spring 335. The chassis 331, the first coupling portion 332 and the first shell 210 can be unibody and be formed by injection molding and so on. The second coupling portion 333 and the second shell 220 can be unibody and be formed by injection molding.

Figure 2:
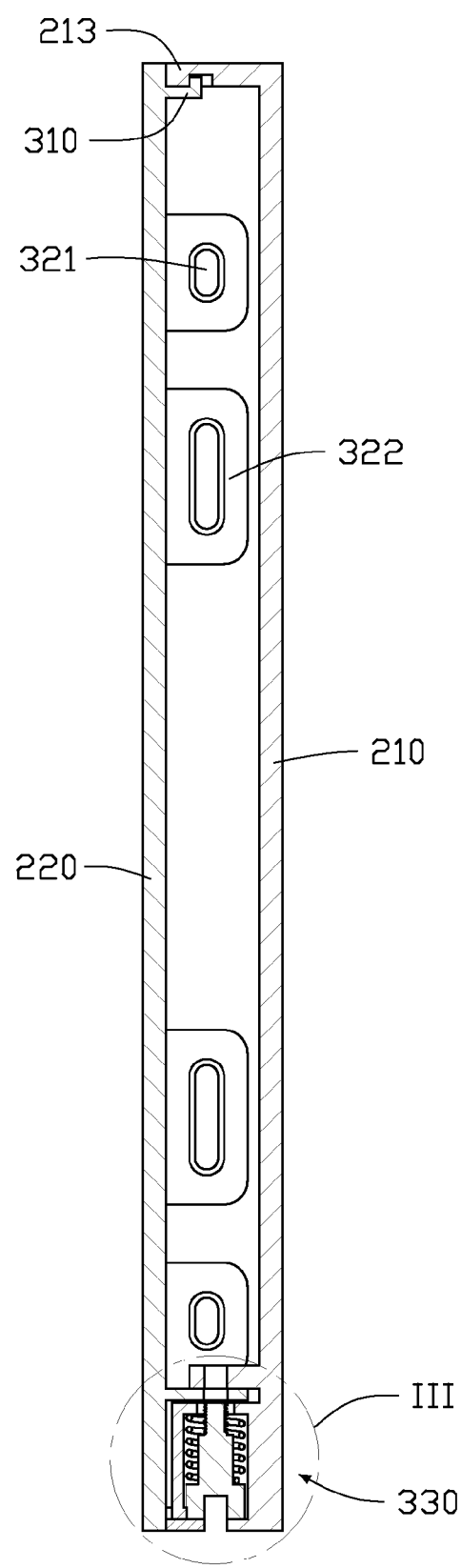
FIG. 2 is a cross-sectional view of the electronic device with the concealed coupling member of FIG. 1.
Figure 3:
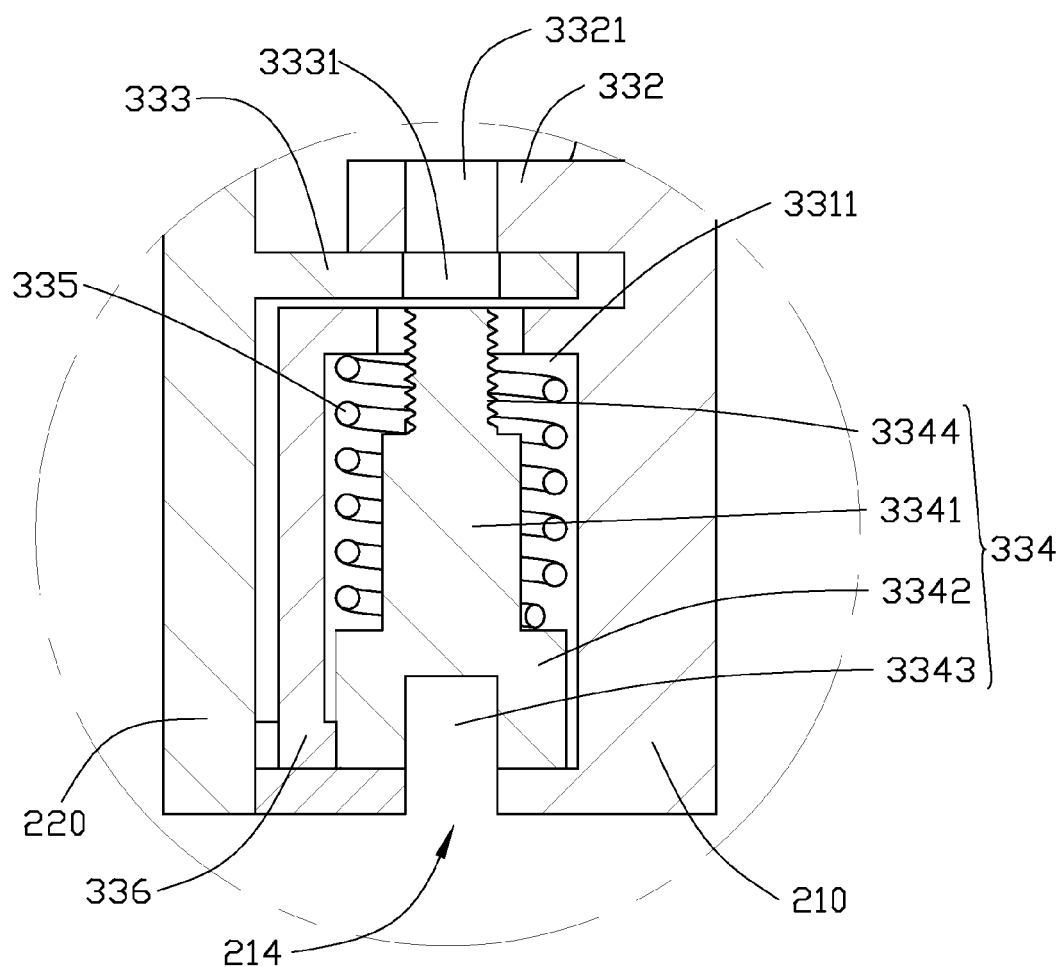
FIG. 3 is an enlarged view of circled portion III of the electronic device with the concealed coupling member of FIG. 2.
Figure 4:
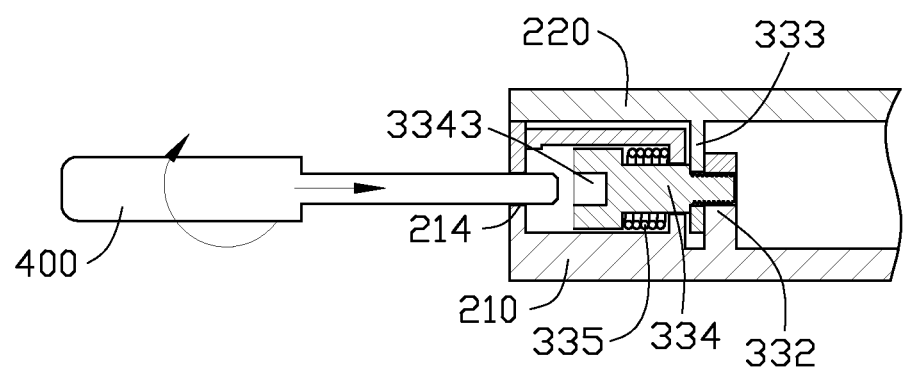
FIG. 4 is a cross-sectional view of a locking mechanism of the electronic device with the concealed coupling member of FIG. 1.

FIGS. 1 to 3 illustrate that the screw 334 can include a rod portion 3341, a head portion 3342 connected to the rod portion 3341. A groove 3343 is defined on the head portion 3342. An external thread 3344 is defined at one end of the rod portion 3341. The rod portion 3341 can be coupled to the second through hole 3321 and third through hole 3331 via the external thread 3344 and the internal thread (not labeled) of the second through hole 3321 and third through hole 3331. The diameter of the external thread 3344 can be less than the diameter of the rod portion 3341. The spring 335 can be coiled around the rod portion 3341 of the screw 334. The locking mechanism 330 can be positioned on the bottom plate 211 and can be adjacent to the one of the plurality of sidewalls 212.

FIGS. 1 to 4 illustrate that the screw 334 with the spring 335 can be received in the receiving groove 3311 of the chassis 331. The cover 336 can cover the receiving groove 3311 to prevent the screw 334 and the spring 335 from deviating from the receiving groove 3311. At least one clasp 310 can be engaged with the flange 213 of one of the plurality of sidewalls 212. At least one second latching member 322 can be engaged with at least one first latching member 321 by pressing the two parallel edges (not labeled) with at least one second latching member 322 of the second shell 220. A tool 400 can pass through the first through hole 214 and rotate the screw 334. The external thread 3344 of the screw 334 can be engaged with the internal thread (not labeled) of the third through hole 3331 and the second through hole 3321 for coupling the first coupling portion 332 to the second coupling portion 333. Therefore, the first shell 210 can be closely coupled to the second shell 220.

In the other embodiments, the third through hole 3331 has no internal thread, the screw 334 can be directly passed through the third through hole 3331 and be coupled to the second through hole 3321, and there is no interference with the coupling action the first coupling portion 332 to the second coupling portion 333. The spring 335 can also be removed, and there is no interference with the screw 334 while coupling the first coupling portion 332 to the second coupling portion 333. In addition, the first through hole 214 of the first shell 210 can be adjacent to other through holes (not shown) such as the sound holes. The first through hole 214 can be similar to the other through holes (not shown) for maintaining a good outward appearance of the electronic device with concealed coupling member 100.

As described above, the first shell 210 can be coupled to the second shell 220 by at least one clasp 310 and the latching mechanism 320. And the first shell 210 can be closely coupled to the second shell 220 by the concealed locking mechanism 330. Therefore, the electronic device with concealed coupling member 100 can have a good appearance and can be convenient to repair and assemble.

The embodiments shown and described above are only examples. Many details are often found in the art such as the other features of an electronic device with concealed coupling member. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, including matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. An electronic device with concealed coupling member comprising:
   a housing comprising a first shell and a second shell, the first shell including a sidewall with a first through hole; and
   a coupling member comprising at least one locking mechanism;
   wherein the locking mechanism comprises a chassis having a first end and a second end, a screw received in the chassis, a first coupling portion positioned in the first shell and adjacent to the first end of the chassis, and a second coupling portion positioned on the second shell;
   the second end of the chassis is adjacent to the first through hole;
   the first coupling portion defines a second through hole;
   the second coupling portion defines a third through hole;
   the first through hole can communicate with the second through hole and the third through hole;
   the screw passes through the third through hole and the second through hole configured to couple the first shell to the second shell.

2. The electronic device with concealed coupling member as claimed in claim 1, wherein the chassis defines a receiving groove configured to receive the screw, the receiving groove corresponds to the first through hole.

3. The electronic device with concealed coupling member as claimed in claim 2, wherein the each of at least one locking mechanism further comprises a cover positioned on the chassis, the cover covers the receiving groove for prevent the screw deviating from the receiving groove.

4. The electronic device with concealed coupling member as claimed in claim 2, wherein the each of at least one locking mechanism further comprises a spring, the spring is coiled around the screw.

5. The electronic device with concealed coupling member as claimed in claim 2, wherein the spring is received in the receiving groove.

6. The electronic device with concealed coupling member as claimed in claim 2, wherein the screw comprises a rod portion, a head portion connected to the rod portion, and a groove defined on the head portion, one end of the rod portion defines a external thread.

7. The electronic device with concealed coupling member as claimed in claim 6, wherein the groove corresponds to the first through hole.

8. The electronic device with concealed coupling member as claimed in claim 6, wherein the diameter of the external thread is less than the diameter of the rod portion.

9. The electronic device with concealed coupling member as claimed in claim 6, wherein at least one of the second through hole and the third through hole defines an internal thread, the internal thread is engaged with the external thread.

10. The electronic device with concealed coupling member as claimed in claim 1, wherein the first shell further comprises a bottom plate and a flange positioned on the plurality of sidewalls.

11. The electronic device with concealed coupling member as claimed in claim 10, wherein the plurality of sidewalls are formed by extending vertically from sides of the bottom plate.

12. The electronic device with concealed coupling member as claimed in claim 10, wherein the coupling member further comprises at least one clasp and a latching mechanism, at least one clasp is engaged with the flange of the first shell.

13. The electronic device with concealed coupling member as claimed in claim 12, wherein the latching mechanism comprises a first latching member and a second latching member engaged with the first latching member.

14. The electronic device with concealed coupling member as claimed in claim 13, wherein the first latching member is positioned on at least one of the sidewalls.

15. The electronic device with concealed coupling member as claimed in claim 13, wherein the second latching member defines a latching hole, the first latching member is engaged with the latching hole.

* * * * *